(12) United States Patent
Chen et al.

(10) Patent No.: US 10,782,339 B2
(45) Date of Patent: Sep. 22, 2020

(54) METHOD AND TEST SYSTEM FOR PROVIDING ACCURATE ANALOG SIGNALS

(71) Applicant: Teradyne, Inc., North Reading, MA (US)

(72) Inventors: Zai-man Chen, Shanghai (CN); Pei-Lai Zhang, Shanghai (CN)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 16/087,276

(22) PCT Filed: Apr. 29, 2016

(86) PCT No.: PCT/CN2016/080584
§ 371 (c)(1),
(2) Date: Sep. 21, 2018

(87) PCT Pub. No.: WO2017/185315
PCT Pub. Date: Nov. 2, 2017

(65) Prior Publication Data
US 2019/0128954 A1    May 2, 2019

(51) Int. Cl.
*G01R 31/00*     (2006.01)
*G01R 31/28*     (2006.01)
(Continued)

(52) U.S. Cl.
CPC ......... *G01R 31/2879* (2013.01); *G01R 31/00* (2013.01); *G01R 31/2601* (2013.01);
(Continued)

(58) Field of Classification Search
CPC ............................ G01R 31/2879; G01R 31/00; G01R 31/2601; G01R 35/005; H01L 22/20
See application file for complete search history.

(56) References Cited

U.S. PATENT DOCUMENTS 5,909,330 A * 6/1999 Carlson ................ G11B 5/6029
                                                         360/31
6,470,225 B1   10/2002 Yutkowitz
(Continued)

FOREIGN PATENT DOCUMENTS

CN      1531779 A    9/2004
CN      1307749 A    1/2005
(Continued)

OTHER PUBLICATIONS

International Search Report for PCT/CN2016/080584, issued by ISA/CN, 2 pages (dated Jan. 25, 2017).
(Continued)

*Primary Examiner* — Kimberly N Rizkallah
*Assistant Examiner* — Alexander Belousov
(74) *Attorney, Agent, or Firm* — Burns & Levinson LLP (57) ABSTRACT

Automatic test equipment with multiple components to generate highly accurate and stable analog test signals and method for operating the test system in semiconductor manufacturing process are disclosed. Output analog signals from existing test systems often fail the stability and accuracy requirement with less than 10 mV variations for testing certain electronic devices, due in part to environmental condition variations such as temperature fluctuations. Traditional compensation mechanisms for temperature variations involve time consuming and disruptive calibration procedures. Disclosed here is a system and method that provides near real-time monitoring and compensation for temperature-induced variations via a digital control mechanism that compensates for environmental variations in a time scale of less than 10 milliseconds and maintains the AC output analog signal with 10 milliVolt accuracy.

5 Claims, 10 Drawing Sheets

(51) Int. Cl.
  *G01R 31/26* (2020.01)
  *G01R 35/00* (2006.01)
  *H01L 21/66* (2006.01)

(52) U.S. Cl.
  CPC ............ *G01R 35/005* (2013.01); *H01L 22/20* (2013.01); *G01R 31/2834* (2013.01)

(56) References Cited

U.S. PATENT DOCUMENTS

| | | | |
|---|---|---|---|
| 7,915,902 | B2 | 3/2011 | Wang et al. |
| 2008/0298801 | A1 | 12/2008 | King et al. |
| 2012/0014423 | A1* | 1/2012 | Mirzaei ................ H03G 3/3042 375/224 |
| 2012/0077446 | A1* | 3/2012 | Kahrizi ................ H04B 17/19 455/73 |
| 2012/0183105 | A1* | 7/2012 | Thelen ................ H03G 1/0088 375/345 |
| 2013/0217339 | A1* | 8/2013 | Asuri .................... H04B 17/14 455/73 |
| 2014/0105264 | A1* | 4/2014 | McLaurin .............. H04B 17/11 375/224 |
| 2016/0050026 | A1 | 2/2016 | Hidri et al. |

FOREIGN PATENT DOCUMENTS

| | | |
|---|---|---|
| CN | 101165499 A | 4/2008 |
| CN | 101009493 A | 7/2011 |
| CN | 102150360 | 10/2014 |
| CN | 104242677 A | 12/2014 |
| CN | 102788956 A | 1/2015 |
| CN | 104297665 A | 1/2015 |
| CN | 104897938 A | 3/2020 |
| EP | 1361450 A1 | 11/2003 |
| TW | I452810 B | 9/2014 |

OTHER PUBLICATIONS

Written Opinion for PCT/CN2016/080584, issued by ISA/CN, 4 pages (dated Jan. 25, 2017).
First Office Action for Chinese Patent Application No. 201680084808.X, (7 pages), dated Jul. 20, 2020. (The concise explanation of relevance for this document is included in the accompanying transmittal.).

* cited by examiner

METHOD AND TEST SYSTEM FOR PROVIDING ACCURATE ANALOG SIGNALS

FIELD OF THE INVENTION

The invention relates generally to automatic test equipment and more particularly to generation of test signals within a test system.

BACKGROUND

Semiconductor devices are tested, often multiple times, during their manufacture. A piece of automatic test equipment, referred to as a "tester" or a "test system", is used to generate test signals that stimulate a device under test (DUT) and to measure the response. The tester determines whether a DUT is operating properly by comparing the response evoked by a carefully controlled test pattern with an expected response.

To fully test devices, the tester should generate and measure signals such as may be found in the operating environment of those devices. Increasing complexity of semiconductor chips has required that automatic test equipment also generate and measure accurately more complex signals. Most semiconductor devices generate or respond to high speed digital signals. Many devices, such as disk drive controllers and processors for video signals, also generate or respond to analog signals. Entire systems, containing both analog and digital electronics, are now widely implemented on single semiconductor devices.

Automatic test equipment must now generate accurately both digital and analog signals. Accordingly, test equipment is typically made to contain multiple instruments. Each instrument performs a specific function, such as generating high speed digital signals or producing an analog signal that has a programmed characteristic. Multiple instruments are installed in a tester to provide the combination of analog and digital signals needed to test a particular device. Creating instruments that provide separate test functions provides a flexible way to create a test system that can generate and measure a set of test signals required for testing virtually any semiconductor device.

A test system is often required to determine both that a specific signal was detected and that the signal occurred at a specific time in relation to a certain stimulus. A circuit called a "pattern generator" is installed in a tester to provide a series of commands to control the generation and measurement of test signals in order to coordinate operation of the various instruments for signals to be generated and measured with specific time relationships.

Figure 1:
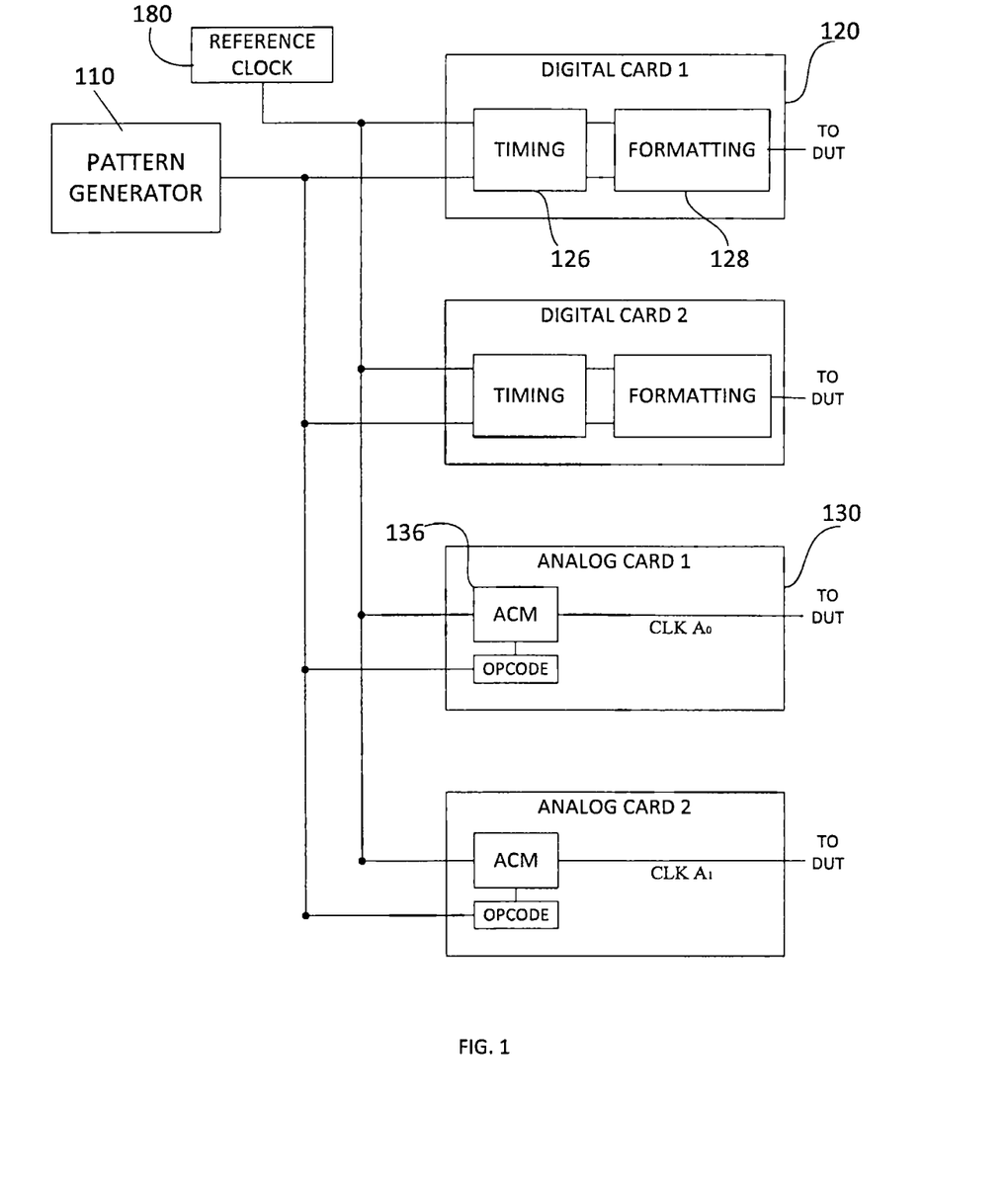
FIG. 1 is a block diagram of an exemplary semiconductor test system.

One example tester architecture is shown generally in FIG. 1 and includes a reference clock generator 180 that generates a clock that is distributed, or fanned out, to a plurality of digital and analog channel cards 120 and 130, respectively. Each analog or digital card may be considered a separate instrument, though it should be appreciated that an instrument is a logical concept and that an instrument may be implemented on multiple circuit cards or, alternatively, may be implemented on a single circuit card along with other circuitry.

Signals generated by a centralized pattern generator 110 are fanned out with a reference clock to the channel cards. Pattern generator 110 issues commands that are to be performed by each instrument. A command may be generated for each instrument for each cycle of the reference clock.

Clock signals for the digital cards are fed to timing circuitry 126, which drives waveform formatting circuitry 128 to produce digital signals for application to the device-under-test (DUT, not shown). The analog cards 130, on the other hand, receive the remotely generated digital reference clock signal and synthesize an analog clock through analog clock module (ACM) 136. The local analog clock CLK $A_0$ drives functional circuitry on one or more analog instruments to output analog signals for application to the DUT.

Certain semiconductor devices operate with highly accurate internal signals. For example, the internal trimming circuits used in smart consumer electronic products such as wireless chargers are highly accurate and will respond differently to signal stimulus that vary by an amount as small as a few milliVolts. During mass manufacturing of such devices, automatic test equipment with instruments capable of generating very accurate analog signals with specific accuracy to reflect the highly accurate signal environment of these electronic devices is needed.

SUMMARY

According to some embodiments, a method of operating a test system to generate an accurate AC analog signal with an AC generating circuit is disclosed. The method comprises selecting a DC target value; generating a DC value representing a characteristic of an AC analog signal output from the AC generating circuit; selectively providing an offset to the DC value based on a difference between the DC value and the DC target value; and applying the DC value with the offset to the AC generating circuit so as to control the characteristic of the generated AC analog signal.

According to some embodiments, a test system configured to generate an accurate analog signal is disclosed. The test system comprises an AC generating circuit. The AC generating circuit comprises a feedforward path comprising an input and an output. The feedforward path has a gain that varies in response to at least one environmental condition. The AC generating circuit also comprises a peak detector comprising an input coupled to the output of the feedforward path and an output coupled to the input of the feedforward path. The test system also comprises a digital controller. The digital controller comprises a target input, a monitor input coupled to the output of the peak detector; and an output coupled to the input of the feedforward path. The digital controller is configured to produce an offset value at the input of the feedforward path based on a difference between values of the signals at the target input and the monitor input.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have recognized that test systems that can generate an AC waveform with an accurate amplitude and high signal stability in the face of environmental factor fluctuations, such as varying temperature, would reduce test times and improve the economics of testing many devices that require accurate AC signals for proper testing. Accordingly, automatic test equipment with components to generate highly accurate and stable analog test signals and method for operating the test system in semiconductor manufacturing process are disclosed. Such test systems may meet stability and accuracy requirements, which for certain electronic devices are less than 10 milliVolt variations, even in the presence of temperature fluctuations or variations in other environmental conditions. These test systems reduce the need time consuming and disruptive calibration procedures. As a specific example, disclosed herein is a system and method that provides near real-time monitoring and compensation for temperature-induced variations via a digital control mechanism that compensates for environmental variations using a calibration process that is fast enough to be performed frequently, requiring less than 10 milliseconds in some embodiments, yet is able to maintain the AC output analog signal with 10 mV accuracy.

Figure 2A:
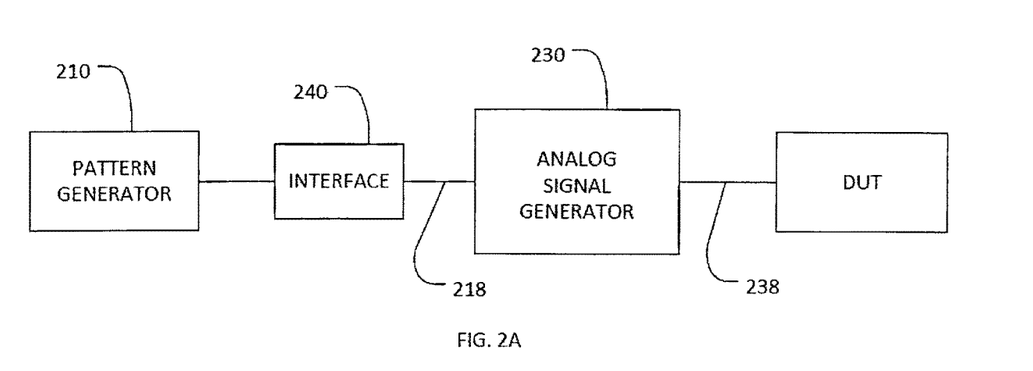
FIG. 2A is a block diagram for an exemplary test system configured to provide an analog test signal to the DUT.
Figure 2B:
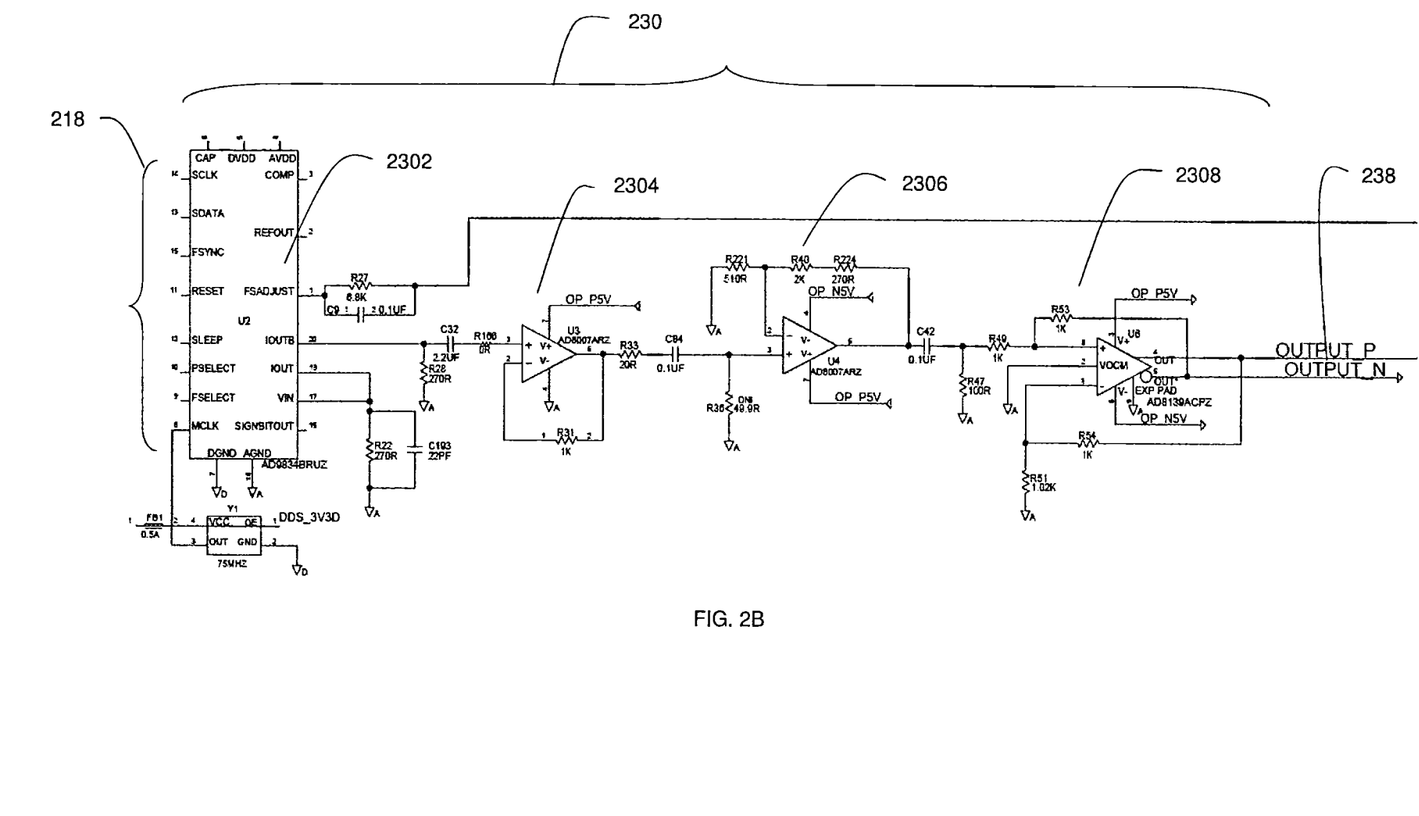
FIG. 2B is a schematic circuit diagram of a portion of the existing tester of FIG. 2A.

FIG. 2A and FIG. 2B are block diagram and schematic circuit diagram, respectively, for an existing tester configured to provide an analog test signal to the DUT. In this existing solution, an analog signal generator 230 receives control signal 218 from a pattern generator 210 via an interface 240, and generates an output analog signal 238 to the DUT based on the control signal 218.

In accordance with some embodiments, the analog signal generator 230 may be configured to generate an output analog signal that has one or more characteristics that are based, at least in part, on the value of signal 218. Those characteristics may be, for example, the amplitude of the AC signal.

In the example circuit diagram in FIG. 2B, the control signal 218 comprises digital signals representing characteristics of an AC signal waveform and timing signals that control the generation of the AC signal. In this example, the analog signal generator 230 uses a direct digital synthesizer (DDS) 2302 to generate the AC signal waveform and a series of amplifiers 2304, 2306, for impedance transfer and signal amplification with known amplification gain factors. Differential amplifier 2308 converts single-ended AC signal into differential signal 238 for output to the DUT.

The accuracy of an AC test signal produced by a test system according to FIGS. 2A and 2B may be diminished by dependencies on environmental conditions. During operation, the signal generator 230 and its components are subject to variations of environmental factors, of which temperature change is used as an example herein. Changes in environmental factors, such as temperature, in turn lead to gain factor shifts. Such gain factor shifts due to temperature variation will lead to shifts in output signal characteristics, for example, shifts in AC signal amplitudes, even when the input control signal remains the same.

In some embodiments, a test system may be calibrated by comparing actual operating conditions to a reference that exhibits the desired signal characteristics. Control values that cause the tester to produce signals with the desired characteristics may be determined and stored as part of the calibration process. These control values, sometimes called calibration values, may be used to control the tester during operation. Such a reference, sometimes called a traceable reference, may be available at the factory where the tester is developed or at the factory that manufactures semiconductor devices using the tester. The calibration values may be collected at the factory and stored in non-volatile memory associated with the tester. This calibration, called factory calibration, may take more than 10 minutes per tester, sometimes requiring hours.

These calibration values derived during a factory calibration sequence are useful for operating the tester under conditions similar to those during the calibration process. To combat such temperature-related shift and maintain an output level accuracy down to a few milliVolts or below, additional calibration may be occasionally performed while the tester is in use. For example the calibration value may be adjusted weekly, daily, between each manufacturing shift in a semiconductor manufacturing facility. This calibration may not use a traceable reference, but may be faster than factory calibration. This type of calibration may take minutes, such as tens of minutes. However, use of the tester in a semiconductor manufacturing process is interrupted to perform a calibration. Each calibration may cost tens of minutes to hours of manufacturing time, which is expensive and undesirable during mass production of the semiconductor device.

The inventors have recognized and appreciated a calibration process that quickly and economically addresses variations in environmental conditions, whether temperature, noise or other environmental factors, during operation of the tester. Additionally, the calibration process may adjust for variation in signal characteristics that depend on the specific type of DUT being tested. For example, the impedance of the output signal line 238 leading to the DUT introduces analog signal attenuation, and the amount of attenuation may depend on the type of DUT. If the type of DUT tested causes attenuation that is different than the attenuation when calibration was performed, the accuracy of the actual output signal received at the DUT is impacted.

Testing with a signal stimulus that is higher or lower than the correct value may lead to "over kill" or "under kill" in mass production, meaning that devices that meet specifications are unnecessarily discarded, reworked or sold with degraded specifications, or devices that do not meet specifications are packaged and sold as fully functioning parts, creating problems downstream. Incorporating techniques as described herein into the manufacturing process for devices may reduce such problems.

Disclosed here is a test system and method that can provide highly accurate and stable output signals with real-time status monitoring and a fast compensation mechanism able to compensate for environmental factors without lengthy disruptive re-calibration during testing sequences.

Figure 3:
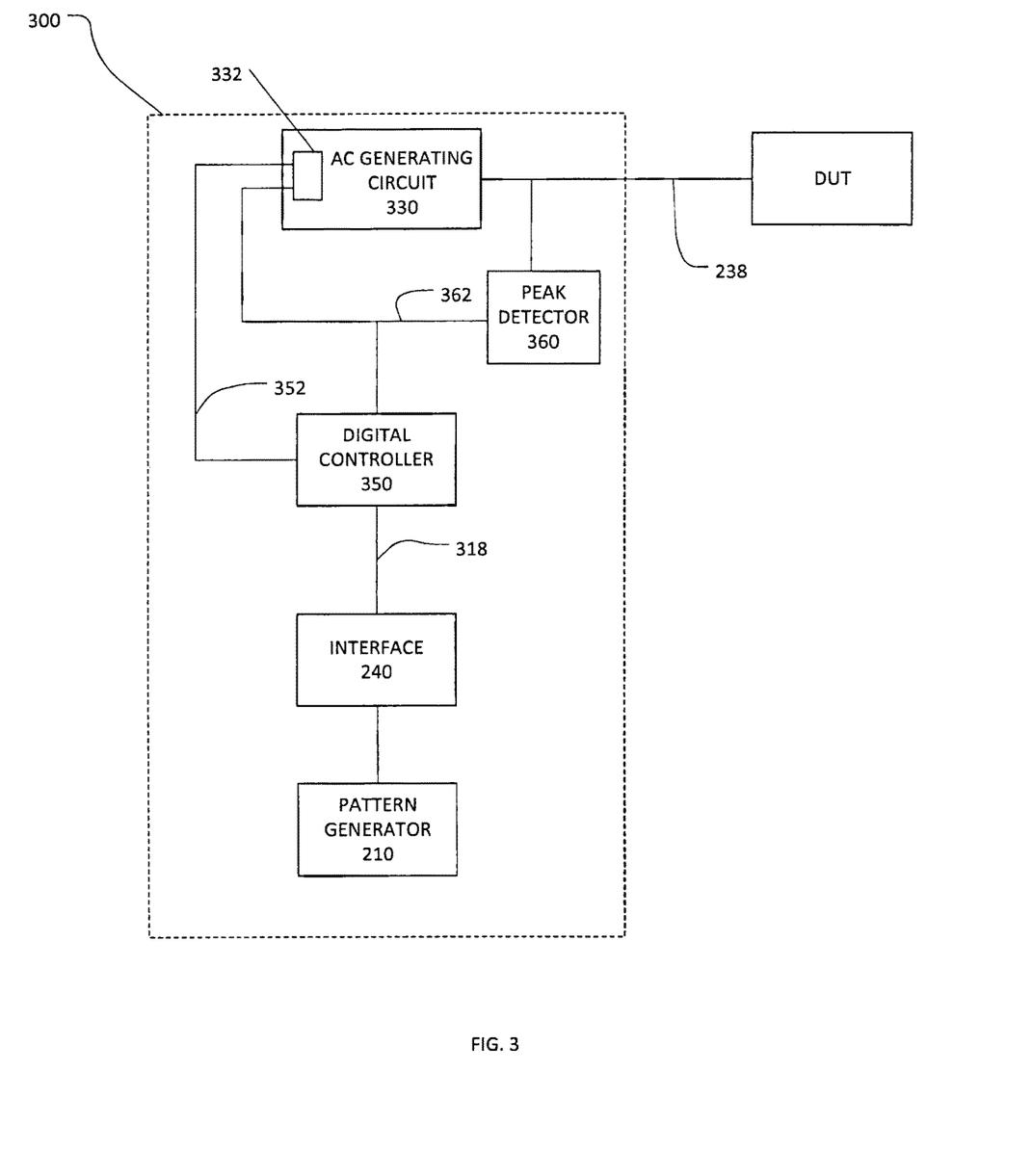
FIG. 3 is a block diagram showing an exemplary test system according to some embodiments.

FIG. 3 shows an embodiment of a semiconductor test system, generally designated as test system 300, configured to output an accurate and stable AC signal. It should be appreciated FIG. 3 illustrates only a portion of a test system for simplicity. The portion may, for example, be a portion of an analog card 130 or other instrument that uses or generates an AC signal for which stability and accuracy of a signal characteristic contributes to the accuracy of test results. In this example, the portion of test system 300 illustrated includes an AC generating circuit 330 for producing AC analog signals, a peak detector 360 that converts the peak-to-peak amplitude characteristic of the output AC signal into corresponding DC levels, and a digital controller 350 connected to the pattern generator 210 via interface 240. AC generating circuit 330 may be implemented according to the schematic of FIG. 2B or in any other suitable way.

As illustrated in FIG. 3, the AC generating circuit 330 generates an AC output signal 238 to the DUT. The peak detector 360 monitors in real-time the signal output 238 and provides at its output a DC level 362 that corresponds to peak-to-peak amplitude of the output 238. In this example, the output of peak detector 360 is representative of a signal characteristic for which accuracy and stability is controlled. Here, DC level 362 is provided as a control input to AC generating circuit 330 to effect, in part, such control, as described further below. The path from the control input to signal output 238 is a feedforward path. A feedback path is provided through peak detector 360 to the control input of AC generating circuit 330. The feedback path may stabilize the characteristics of the output signal 238. For example, so long as environmental conditions that might affect gain of the feedforward path remain the same, the amplitude of output signal 238 may be stable.

Control of a characteristic of the AC signal is also affected in part by a digital controller 350. In some embodiments, an output of digital controller 350 is also coupled to the control input of AC generating circuit 330. In accordance with some embodiments, the level of that output of the digital controller may control the amplitude of the AC signal at which the output of the AC generating circuit 330 stabilizes. In some embodiments, digital controller 350 may operate to output a value that stabilizes the amplitude of the AC signal at a programmed value, even over a range of environmental conditions.

In some embodiments, digital controller 350 may intermittently operate to determine an appropriate value at its output. This level may then be maintained until the next time at which digital controller 350 operates to adjust its output. For example, digital controller may adjust its outputs between runs of a test program, such as during an interval of time when one or more devices are being positioned for testing but before a test is run on those devices. In contrast, feedforward path and the feedback path may operate continuously while an AC signal is being generated to provide real time stabilization of the AC signal.

In the example of FIG. 3, Digital controller 350 is connected so that it can determine the difference between the DC value 362 representing the output signal amplitude and a target value 318 communicated via the interface 240. The target value 318 may represent a previously determined value for the output of peak detector 360 when the generated AC signal has a desired signal characteristic. In the example of FIG. 3, that target value 318 may be measured, such as through calibration and encoded in a test pattern. As a result, when a test is run, the target value 318 may be specified by the pattern generator 210.

Based on the difference between the DC value 362 and the target value 318, digital controller 350 selectively provides a correctional offset 352. Correctional offset 352, when combined in a controller interface 332 with the feedback from peak detector 362, adjusts the AC generating circuit 330 to output an AC signal 238 with an accurate AC amplitude at a desired value. This AC signal 238 is both accurate and stabilized such that when it is provided to the DUT as part of a test, the test is more accurate. The manner by which the digital controller 350 determines the appropriate value of correctional offset 352 is described below in connection with FIG. 7.

AC generating circuit may be any suitable signal generator adapted to output an analog AC waveform to be provided as stimulus to the DUT during testing in manufacturing. The analog AC waveform may be a sinusoidal signal, a triangular wave, a square wave, or any other suitable signal form. The AC generating circuit may be controllable to adjust a characteristic of the signal. That characteristic may be the peak-to-peak amplitude, frequency, duty cycle, but can also be any other suitable characteristic of an analog AC waveform.

AC generating circuit 330 may be any suitable circuit, designed using known circuit design techniques or any other suitable technique that generates an AC analog signal with a characteristic at the output 238 that varies in response to control input received via the controller interface 332. In one example, the AC generating circuit generates an AC sinusoidal waveform with an amplitude nominally proportional to the control input. When the control input signal increases, the generated AC sinusoidal signal amplitude increases; when the control input signal decreases, the generated AC sinusoidal signal amplitude decreases. Therefore the output signal may be adjusted by tuning the control input in order to ensure a stable test signal to the DUT.

The peak detector 360 is adapted to convert an AC characteristic of the output AC signal 238 into a DC value 362 for comparison in the digital controller 350 and for feedback into the AC generating circuit 330. Depending on the characteristic of the analog signal being measured, the peak detector may employ any suitable circuit for converting the AC characteristic into a DC value using one or more conversion factors. For example, the peak detector may convert the peak-to-peak amplitude of a sinusoidal waveform into a DC value proportional to the amplitude.

Figure 3A:
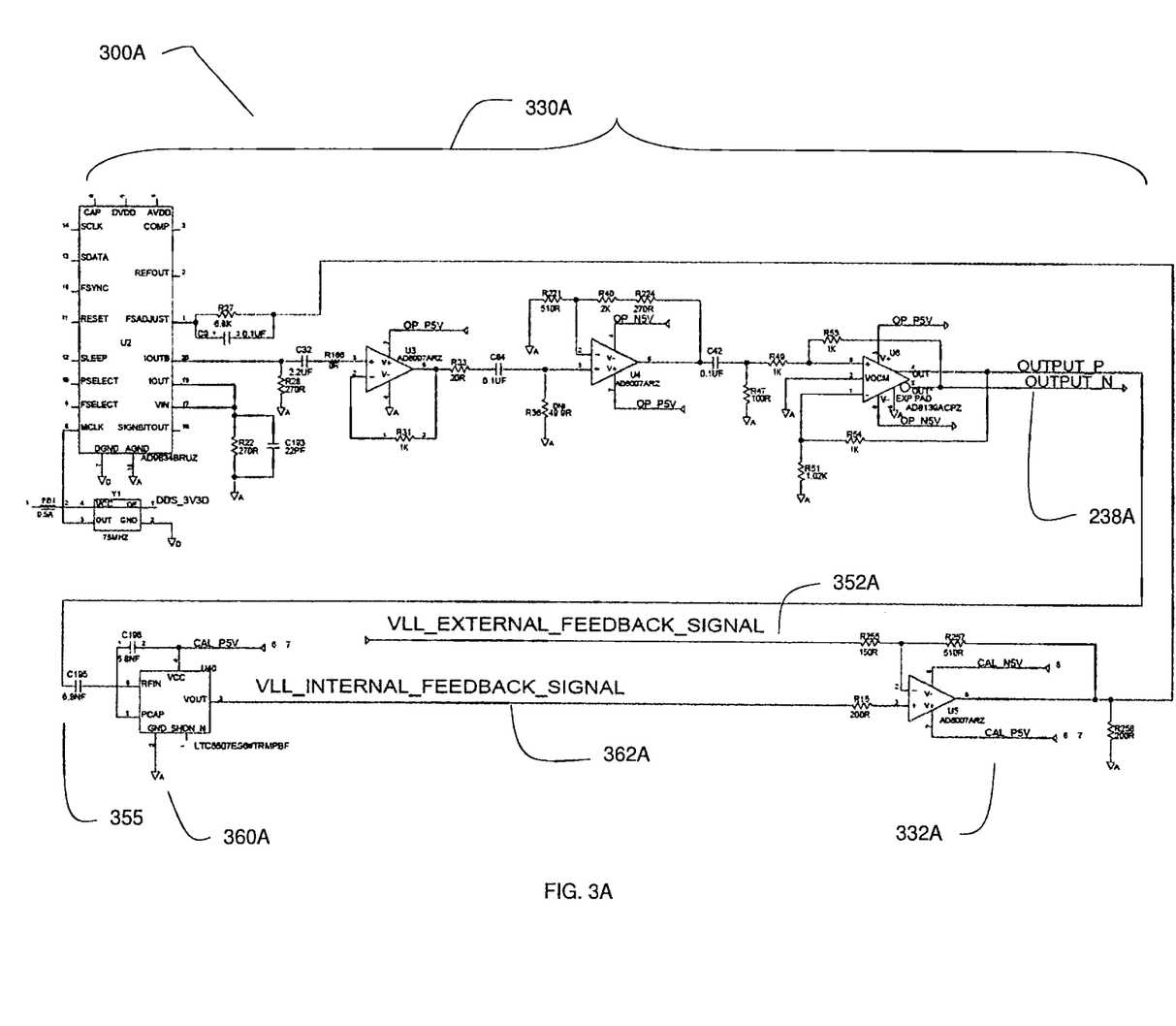
FIG. 3A is a schematic circuit diagram of a portion of an exemplary test system.

FIG. 3A shows a circuit diagram of a portion of an exemplary test system 300A that includes an AC generating circuit 330 similar in some aspect to the analog signal generator 230 in the exemplary tester in FIG. 2B. Test system 300A further includes a feedback input unit amplifier 355 that connects to the output 238 to provide a large input impedance and low leakage current when sampling the output 238 as feedback. The feedback input unit amplifier 355 is connected to a peak detector 360A to convert the sampled output AC signal into a DC value 362A representative of a characteristic of the output AC signal. The DC value 362A is combined with an offset signal 352A from a digital controller (not shown) inside a controller interface 332A connected to the AC generating circuit 330A. The offset value 352A may be set by the digital controller to dynamically adjust the control input to the AC generating circuit in order to generate and maintain an accurate and stable signal and compensate for any variations due to environmental conditions.

In some embodiments, the gain of AC generating circuit 330, establishing the proportionality between the control input and output characteristic, may be dependent on temperature or other environmental conditions. Variability of that gain might not be fully corrected by feedback provided from peak detector 362 to the control input of AC generating circuit 360. Digital controller 350 may provide a further signal 352 to the control input of AC generating circuit 330 to assist in correcting for such variability.

In the embodiment according to FIG. 3, digital controller 350 comprises an arithmetic unit to compare the detected DC value 362 from the peak detector representing the characteristic such as amplitude of the output AC signal to a target value 318. The circuitry of the digital controller may be implemented in an FPGA or custom integrated circuit. Alternatively or additionally, the circuitry may be implemented in a processor or microcontroller that is programmed to perform the functions described herein. In some embodiments, the target value 318 may be in the form of a DC target value representing the output of peak detector 360 when the AC signal has a desired target amplitude. Digital controller 350 may compare the DC target value with measured DC value 362. The DC target value may be hardwired into the test system when it is manufactured, such as may occur when the circuitry in FIG. 3 is designed to output an AC signal at a single level. Alternatively, the DC target value may be programmable and, for example, may be manually inputted by a test engineer and recorded in a test pattern via a UI interface, such as a computer work station (not shown). Alternatively, the DC target value may be selected or generated by other instruments or components in the automated test equipment. Any suitable signal form for communicating the target value 318 with the digital controller may be used, for example, as an analog DC voltage, or as a digital value representing the numeric value of the DC target value.

The digital controller outputs an offset signal 352 based on the difference between the target DC value 318 and measured DC value 362. As will be discussed in more detail below, the offset may be determined by the digital controller repeatedly, each time under environmental conditions at the time of the computation. By repeatedly computing the offset the digital controller compensates for shifts in the output AC signal that might otherwise be caused by changes in environmental conditions.

In some embodiments, the steps of measuring and comparing to determine a new value of the offset may take only a few milliseconds, and can be repeated between runs of a test program or at any other suitable interval that is short relative to the time it takes for changes in environmental conditions to impact characteristics for the generated AC signal. The feedback path, operational during a run of the test program, enables real-time determination of whether and how much the signal output deviates from a set target and allows a fast response to correct the deviation to ensure a stable signal output. Thus, the AC signal has a characteristic that is both stable and accurate. In one example, the amplitude of the output AC signal may be set at 1 Volt nominally and may vary by no more than 1 milliVolt during operation of the tester.

At each recalculation of the offset signal 352, digital controller 350 may use an iterative process to determine the value of offset signal 352 that is appropriate for the current environmental conditions. Digital controller 350 may include a sequencer, state machine or other suitable control circuitry to cause it to perform multiple iterations of a process. At each iteration, digital controller 350 may compare the detected DC value of the output signal 362 with the target DC value. Digital controller 352 may increase or decrease offset 352 in a direction that should bring the output signal 362 closer to the DC target value. Digital controller 352 will apply the updated offset to the controller interface 332 until the AC generating circuit, which will change the output signal 362. Iterations may proceed until the AC generating circuit generates an AC signal with a characteristic that leads to the correct output signal with a DC value 362 from the peak detector corresponding to the dynamically adjusted target DC value. Digital controller 350 may retain this value of offset signal 352 until the recalculation. In this way, the AC signal will be accurate, meaning that it will have the desired value of the characteristic to within a tight tolerance, even if environmental conditions change.

The desired value of the signal characteristic is determined by the value of the target DC value. The target DC value may be set in any suitable way. In the embodiment of FIG. 3, that target DC value may be pre-programmed, and may be applied for all environmental conditions. In some embodiments, it may be desirable to enable a tester to vary the amplitude of the AC signal being generated. A mechanism may be provided to enable the test system to select a DC target value appropriate for each programmed value of the amplitude. Alternatively or additionally, in some embodiments, the target value may depend on environmental conditions. In such a scenario, it may be desirable for the test system to be configured to select a target DC value appropriate for the current environmental conditions.

Figure 4:
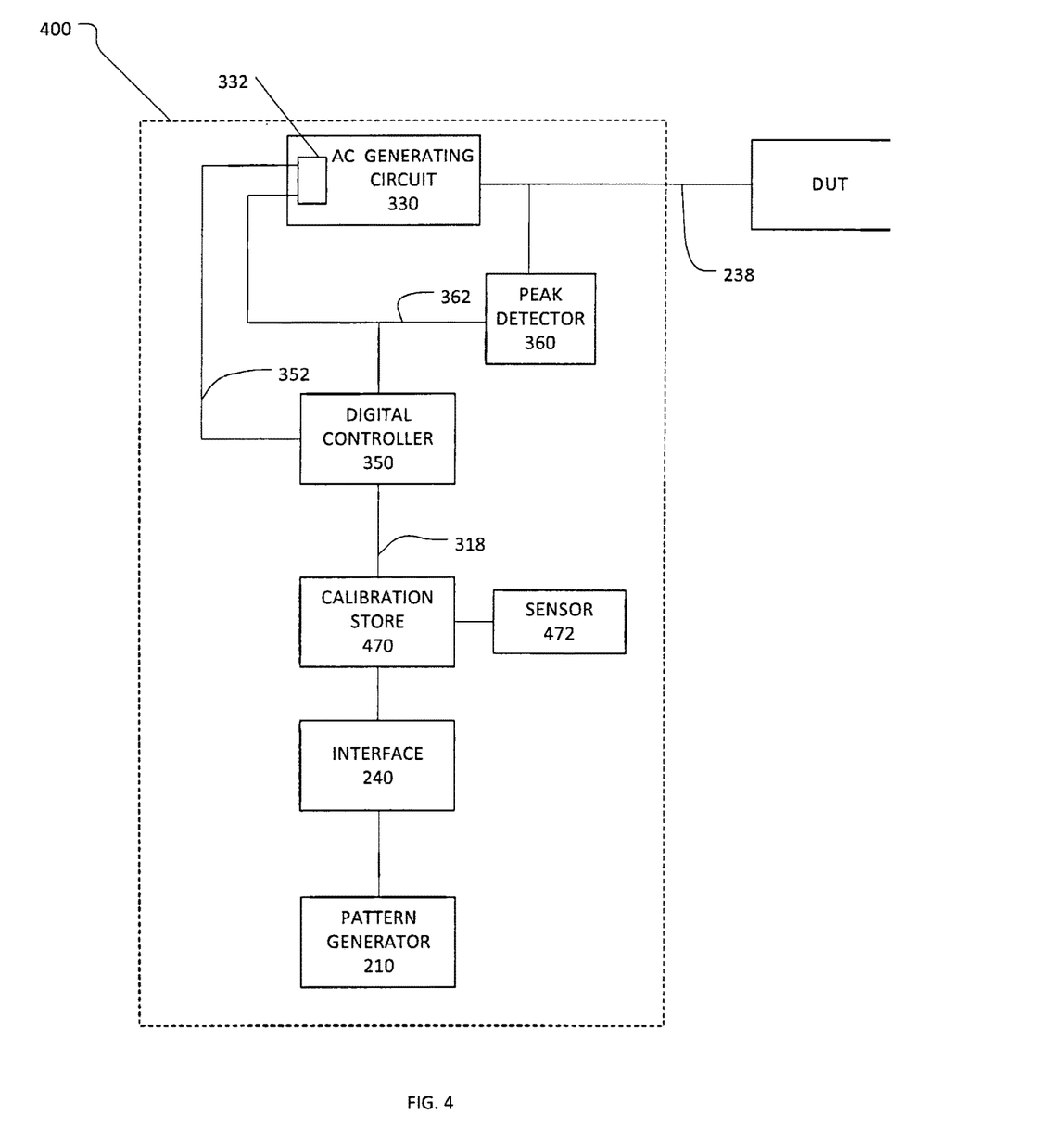
FIG. 4 is a block diagram showing a second exemplary test system according to some embodiments.

FIG. 4 shows an embodiment of a test system 400 that selects a target DC value based on a programmed AC amplitude and current environmental conditions. Test system 400 is similar to test system 300 as shown in FIG. 3, with like elements having like reference numerals. Test system 400 further includes a calibration store 470 and at least one environmental sensor 472 to provide dynamic compensation for environment-induced variations in output signal.

According to some embodiments, the sensor 472 in FIG. 4 is an environmental sensor that monitors in real-time environmental conditions of the system components. The calibration store 470 includes a memory that stores a look-up table of DC target values, indexed by desired target amplitude values and environmental conditions such that for each combination of measured environmental condition and target amplitude, a DC target value can be looked-up. In this example, the target amplitude value is output from pattern generator 210, but the target amplitude may be determined in any suitable way, including using techniques as described above in connection with FIG. 3. The DC programmed value is then sent to the digital controller 350 as the DC target value 318 to be compared with the detected DC value 362 from the peak detector.

It should be appreciated that in some embodiments, sensor 472 may not be required and calibration store 470 may store a single target DC values for each target amplitude value. Such a configuration may be used, for example, when the temperature sensitivity of peak detector 360 is much lower than temperature sensitivity of AC generating circuit 330. For example, the temperature sensitivity of peak detector 360 may be 25% or less of the sensitivity of AC generating circuit 330, such as 10% or less.

It is also not necessary that test system store calibration values for multiple programmed values. In an embodiment in which the test system outputs an AC signal with a fixed amplitude, there may be values in calibration store 470 for only a single programmed value. Accordingly, calibration store 470 may store as few as one calibration value, in some embodiments.

The look-up table in calibration store 470 may be determined, for example, during a factory calibration process that is initiated at the time of manufacture of the test system. Alternatively or additionally, the values in calibration store 470 may be generated occasionally prior to mass production testing of DUTs with the test system.

Figure 5:
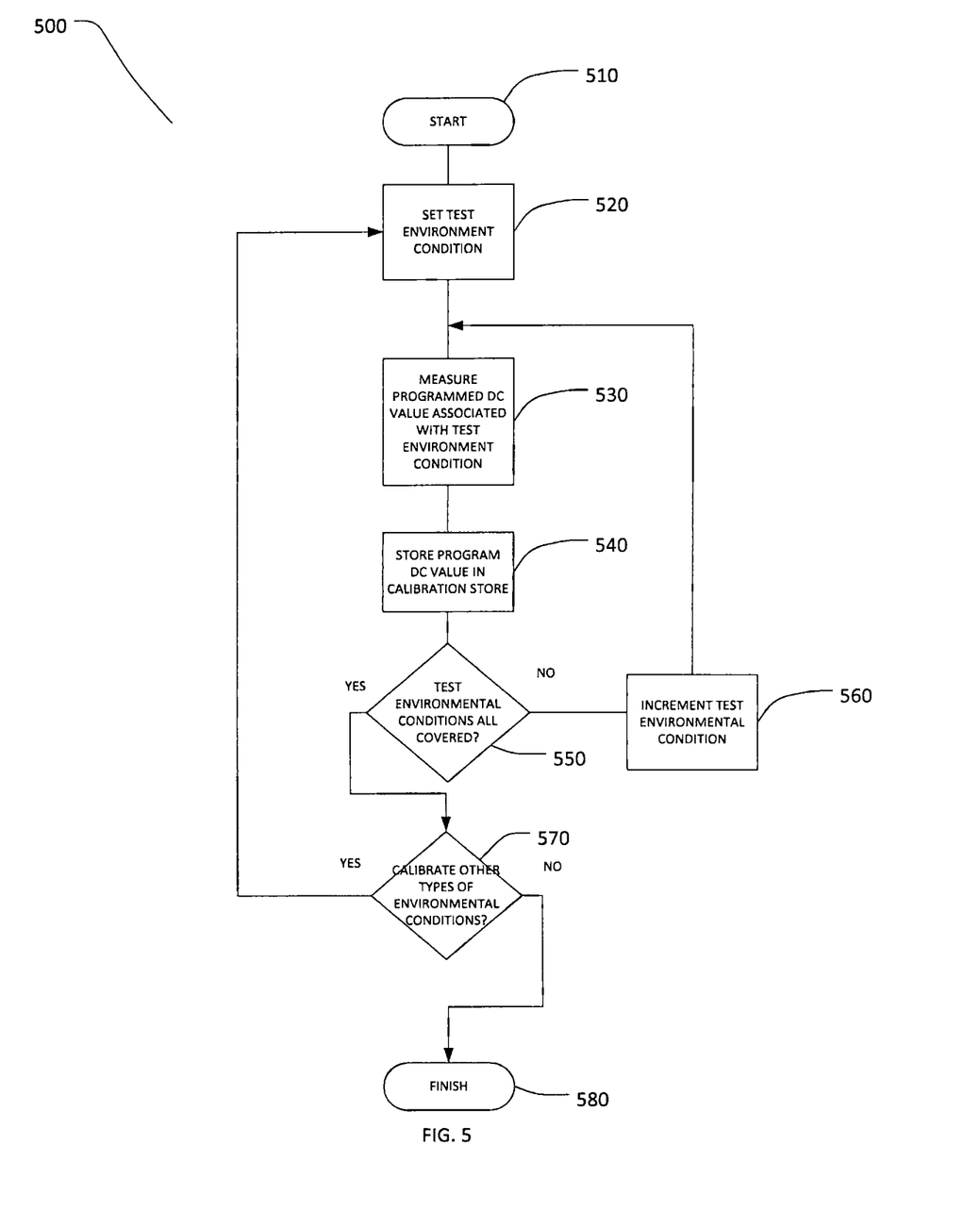
FIG. 5 is a flow chart showing an exemplary calibration process according to some embodiments.

FIG. 5 is a flow chart showing the process 500 of determining the look-up table in the calibration store 470 during a factory calibration process according to one embodiment. As shown in FIG. 5, at the start of the calibration 510 an environment condition such as temperature is selected in block 520. In block 530, for each temperature value within a pre-determined operating temperature range, the test system 400 as shown in FIG. 4 is placed under the particular temperature condition as measured by a temperature sensor 472 and a calibrated correct AC output signal of a desired characteristic is connected to the output 238 to produce a corresponding detected DC value from the peak detector 360 at such operational temperature. The detected DC value is stored as a programmed value in the look-up table in the calibration store in connection with the measured temperature and the desired output signal characteristic in block 540. The temperature is incrementally varied in block 560 according to end point condition 550 and at each temperature condition a DC programmed value that corresponds to expected output amplitude from the peak detector 360 when the AC output signal is correct is measured and stored in the look-up table. In this example, the range of temperature values may be selected from the range of temperatures within the tester during normal manufacturing operation.

More than one type of environmental condition may optionally be calibrated and compensated. In some embodiments, the look-up table may be indexed by multiple types of environmental conditions. More than one environmental sensor 472 may be included in the test system in FIG. 4, each monitoring different types of environmental conditions such as but not limited to temperature, electromagnetic interference and moisture. As shown in FIG. 5, at the conclusion of a test covering all predetermined values for one type of environmental condition, the calibration process may switch to a another type of environmental condition according to an end point condition 570 or proceed to finish 580.

During operation, the calibration store 470 obtains a command from the pattern generator 210 via the interface 240 to generate a signal with a desired target amplitude, receives a temperature reading from the temperature sensor 472 and determines a DC programmed value according to the look-up table. By continuously monitoring both the environmental condition and output signal amplitudes, the test system can dynamically map the DC target value to a pre-programmed level for which the AC generating circuit has been calibrated to generate the correct output signal at the particular environmental condition, the test system as disclosed in the embodiments above enables continuous generation of accurate test signals without time consuming calibration steps every time a major temperature related equipment parameter shift or drift appears. Since the DC to DC comparison can be performed in the digital controller 350 within a time period on the order of several milliseconds, the test system according to some embodiments may compensate quickly for output signal output amplitude variation in a near real-time fashion. Regardless of the magnitude of output signal variation, the AC generating circuit will generate a corrected signal based the offset from the digital controller within the millisecond level processing time. Comparatively, the inventors have recognized that conventional systems that uses a simple analog feedback loop require longer time to correct larger signal variations, and for very large variation due to for example a large temperature swing, have difficulty converging back to the correct signal output.

Figure 6:
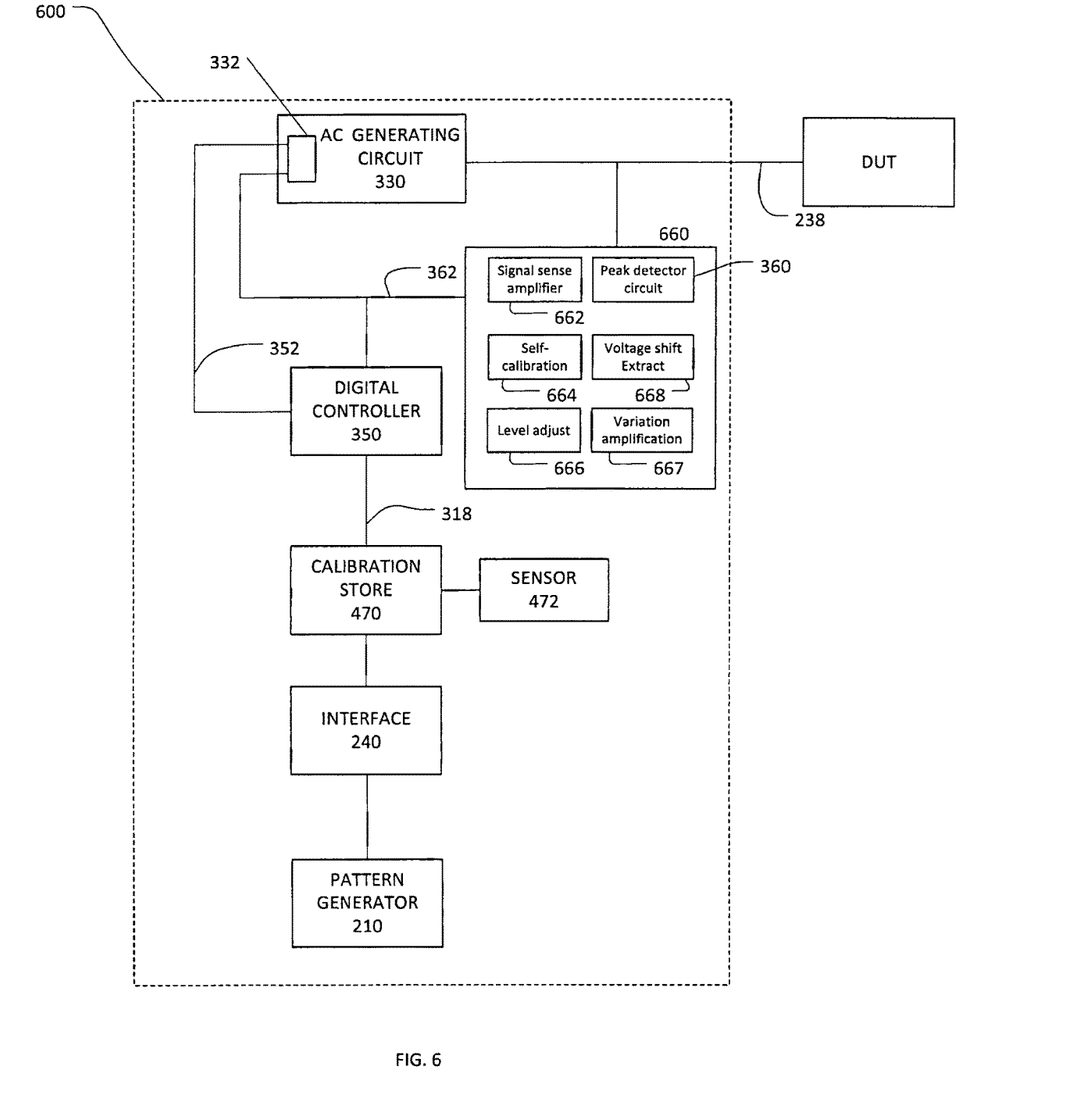
FIG. 6 is a block diagram showing a third exemplary test system according to some embodiments.

FIG. 6 shows a block diagram of an embodiment test system 600. Test system 600 is similar to test system 400 and further includes a group of functional analog circuit units 660 besides peak detector circuit 360. In some embodiments, these circuit units 660 may be implemented in any suitable way to provide a low sensitivity to changes in environmental conditions at the output of peak detector circuit 360. The tester includes a signal sense amplifier 662 to amplify the output analog signal, which could further improve the level control accuracy. A self-calibration circuit 664 makes sure signal sense amplifier and peak detector circuit are working properly. A level adjust 666 and voltage shift extract circuit 668 that process the difference between output AC signal level and the target value and extract the voltage difference delta. A variation amplification circuit 667 will amplify the voltage difference delta, which when combined with the offset signal from the digital controller could feedback to the controller interface 332 of the AC generating circuit to compensate for the output signal level shift or drift due to environmental conditions.

The test systems 300, 400 and 600 of FIGS. 3, 4 and 5 as presented above provide non-limiting examples of various aspects of test system configured to provide an accurate and stable AC signal. According to some embodiments, some or all circuit components in the example testers above may be separate instruments connected with any suitable digital and/or analog communication means. Some or all circuit components may be in the form of an instrument card in order to save space and assist with thermal management within a housing of the automatic test equipment. Some circuit components from different functional units may be integrated in one instrument card.

Figure 7:
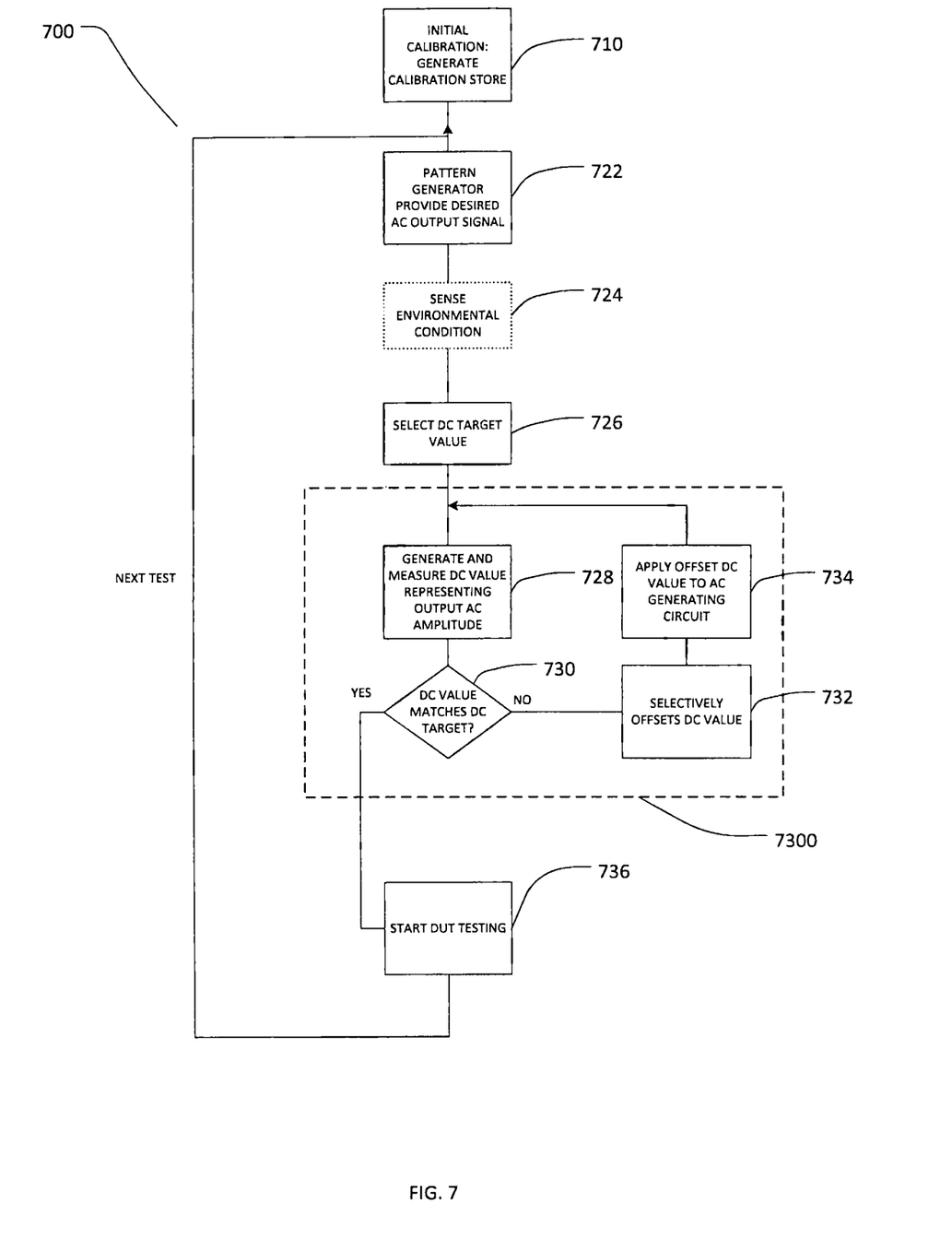
FIG. 7 is a flow chart showing an exemplary operating process of the test system according to some embodiments.

Having described various embodiments of the test system components, FIG. 7 provides a flow diagram showing an exemplary process 700 for operating a test system to generate an accurate AC analog signal with an AC generating circuit, in accordance with aspects of the current invention. The exemplary process 700 may be used in manufacturing semiconductor devices to repetitively performing a test sequence applying an analog signal to a device under test.

As shown in FIG. 7, the exemplary process 700 may begin at block 710 with an initial calibration prior to testing of semiconductor devices. During initial calibration, a range of environmental conditions may be reproduced similar to steps described above in relation to FIG. 5 in order to generate a calibration store of parameters. However, as described above, a test system may be configured such that as few as one calibration value is stored for a circuit to generate an AC signal of a fixed amplitude. The DC values programmed in the calibration store correspond to what the test system DC target value should be at each certain environmental condition such as temperature. Although the initial calibration may be a slow process that takes up to 10 minutes in order to exhaust the list of environmental conditions to be reproduced in the calibration store, it is only required to be performed infrequently, such as once at the end of the manufacture of the tester or once every few weeks or months once a tester is put into operation so as to create or update the calibration store. Similarly, in another example when the test system is relocated to a different location or inside a different enclosure with a new set of temperature and/or electromagnetic noise profiles, it may be desirable to re-calibrate the tester by updating the calibration store according to block 710. After the calibration in block 710, subsequent testing process according to process 700 can be performed without lengthy interruption with near-real time compensation for temperature or other environmental condition variations according to aspects of the current invention as described in detail below.

Once initial calibration is completed, testing using the test system commences at block 722, where an instruction from the pattern generator 210 is provided to provide a desired AC output signal with a certain characteristics. For example, the pattern generator 210 may instruct via the interface 240 the test system to generate an output stimulus as an AC sinusoidal wave with a frequency of 100 MHz and 60 mV peak-to-peak amplitude. The numerical values provided in the preceding example are for illustrative purpose only, and one should recognize that during testing of semiconductor devices in manufacturing, the pattern generator may instruct the tester to generate any suitable signal characteristics to simulate the normal operational condition of the device under test.

Optionally at block 724, the test system may use one or more environmental sensors 472 to detect for example the temperature of the internal components. Alternatively, the environmental condition may be transmitted from sensors embedded in one or more instruments within the test system, or from a suitable external source.

At block 726, the digital controller 350 may use the sensed environmental condition and programmed value of the AC signal to select a calibrated DC target value from on the calibration store. Though, as described above, in some embodiments environmental conditions may not be sensed or be used in the selection of a target DC value. Similarly, the test system may be configured to generate an AC signal of just one value, and a programmed value also may not be used for the selection of a DC target value in some embodiments.

Regardless of the manner in which the target DC value is selected, it may be used in to set the offset out of the DC controller that is used in generating an AC signal. The offset may be determined in blocks 728, 730, 732 and 734. At s block 728, the AC generating circuit is used to generate an AC analog signal to be output to the DUT. The output AC analog signal is measured by the peak detector 360 to convert the AC signal characteristic such as amplitude into a DC value 362 representing the amplitude.

At block 730, the converted DC value from the peak detector is compared with the selected DC target value inside the digital controller and if they do not match, the digital controller recognizes that the output AC analog signal amplitude has deviated from the correct value and compensation is needed.

At block 732, when the DC value does not match the DC target value, the digital controller 350 incrementally adjusts the offset value. For example, the offset may have a value that equals a portion of the difference between the measured DC value and the DC target value. In one non-limiting example, the offset may be determined by dividing the difference between the measured DC value and the DC target value by a fixed divisor ratio N. N may be any suitable integer number, such as 10.

At block 734, the digital controller 350 applies the offset 352 to the control interface 332 of the AC generating circuit. The control interface 332 combines the offset 352 with the measured DC value 362 to configure the AC generating circuit to generate a corrected AC analog output signal. In one non-limiting example, the control interface 332 sums up the offset 352 with the measured DC value 362.

A subprocess 7300 that includes blocks 728, 730, 732 and 734 iterates until at block 730 the digital controller determines that the measure DC value from the peak detector equals the DC target value. In some embodiments, the iteration may stop after being performed M times. The integer number M may be any number selected to make sure sufficient compensation is provided at the AC analog output. Owing to the fast DC-DC comparison performed inside the digital controller, blocks 728 to 734 may be performed within a short amount of time interval, such as less than 10 milliseconds, providing fast compensation for the environmental condition induced output signal shifts or drifts.

Accordingly, this subprocess 7300 may be repeated during operation of a test system. As a specific example, the subprocess 7300 may be performed between testing of devices. In a semiconductor manufacturing operation, devices may be presented singly or in groups to the test system for testing. As this presentation of different devices under test requires time for mechanical movement of the devices under test, there may be a gap in device testing as the system gets ready for testing another group of devices. The subprocess may be performed during this gap in testing, adding little or no extra time to the testing portion of the manufacturing operation. However, in some embodiments, the subprocess may be performed after the devices under, which are about to be tested, are connected to the test system. Executing the subprocess in this configuration may compensate for any changes in the output due to the impedance variation of the specific devices under test.

Regardless of when and how often the subprocess is repeated, after the stop condition is met, the test system has an offset value that is compensated for the environmental conditions. The test system may maintain the selected offset value and DC target value throughout the remainder of the testing process for the specific devices under test. The test system provides a stable and accurate AC output signal for testing of the DUT for which that value was determined, and, in some embodiments for other DUTs that are tested close enough in time that the environmental conditions have not changed enough to impact accuracy.

The subprocess may be repeated at intervals. The length of the intervals may be based on the rate at which environmental conditions change. For example, the subprocess may be repeated every ten minutes or at the end of the testing process 736. Accordingly, from time to time, a new compensation process may be started from block 722 prior to starting a new test for another batch of DUT, in order to compensate for any environmental variations during the time period of testing the previous batch of DUT or to provide a different set of desired AC output characteristic via the pattern generator.

Figure 8:
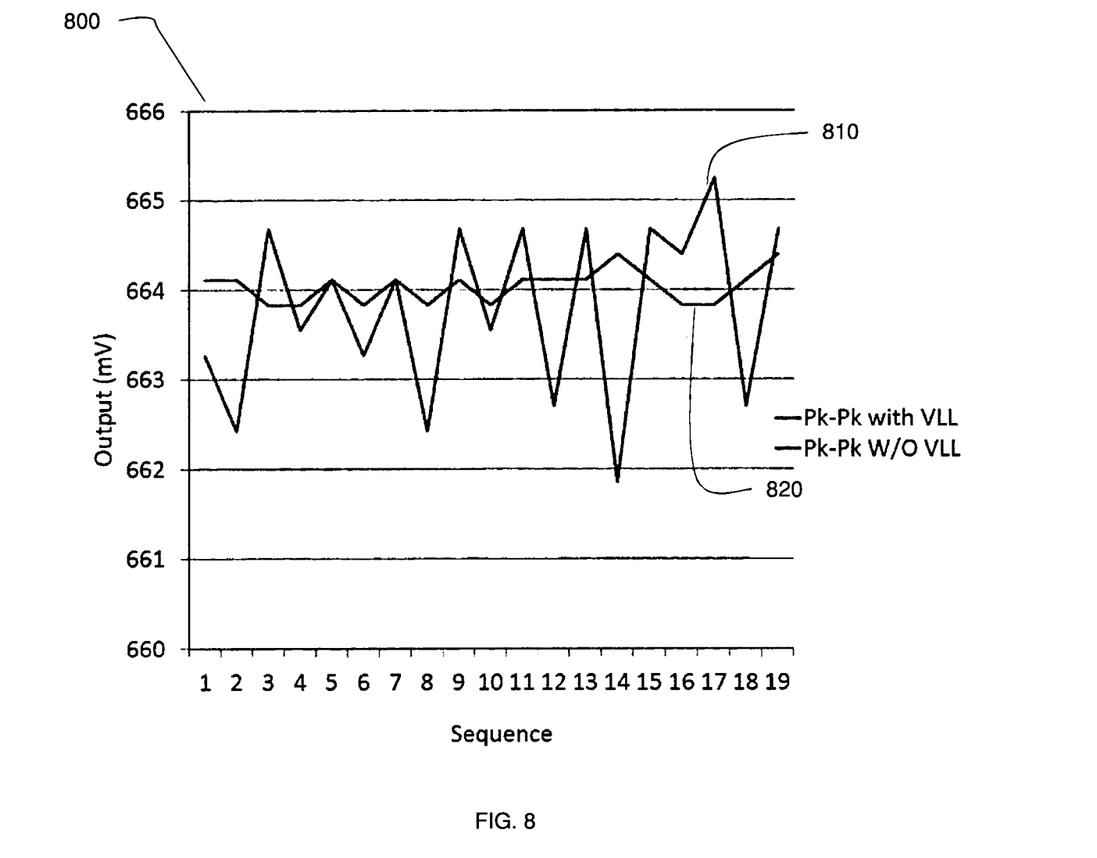
FIG. 8 is a plot of measured traces of output signal amplitude versus sequence number according to an exemplary test system according to aspects of the current invention, and a test system without the disclosed features.

FIG. 8 is a plot of measured AC output signal amplitude versus testing sequence number. The data trace 820 is measured from the output of an example test system of the current invention incorporating the digital control feature and exhibits a variation of less than 1 mV around an average amplitude value of about 664 mV. The example illustrates the effectiveness of the compensation mechanism to stabilize and increase accuracy of the output analog signal, compared to the more than 3 mV variations in the data trace 810 as measured from a system without the compensation mechanism disclosed in the current application.

Having thus described several aspects of at least one embodiment of this invention, it is to be appreciated that various alterations, modifications, and improvements will readily occur to those skilled in the art.

For example, additional measures may be used in combination with the disclosed embodiments to further improve accuracy and stability of the output signal. The measures may include for example shielding for external noise and thermal management techniques to control temperature variations.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A test system configured to generate an accurate analog signal, the test system comprising:
    an AC generating circuit comprising:
        a feedforward path comprising an input and an output, the feedforward path having a gain that varies in response to at least one environmental condition; and
        a peak detector comprising an input coupled to the output of the feedforward path;
    and an output coupled to the input of the feedforward path;
    a calibration store configured to store target values for the output of the peak detector under each of a plurality of environmental conditions based on programmed values of a characteristic of the analog signal; and
    a digital controller comprising:
        a target input;
        a monitor input coupled to the output of the peak detector; and
        an output coupled to the input of the feedforward path;
    wherein the digital controller is configured to produce an offset value at the input of the feedforward path based on a difference between values of signals at the target input and the monitor input.

2. The test system of claim 1, further comprising:
    an interface configured to receive a programmed value;
    wherein the digital controller is configured to retrieve, based on the programmed value, a selected value from the calibration store.

3. The test system of claim 1, wherein:
    the digital controller is configured to incrementally adjust the offset value until a stop condition is reached, wherein a stop condition comprises at least the values of the signals at the target input and the monitor input being equal.

4. The test system of claim 3, wherein:
    the stop condition further comprises a predetermined number of incremental adjustments having been performed.

5. The test system of claim 3, wherein:
    the test system is configured to perform test sequences on a plurality of semiconductor devices; and
    the digital controller is configured to incrementally adjust the offset value between the test sequences and to maintain the offset value during the test sequences.

* * * * *